US006509386B1

(12) United States Patent
Kohl

(10) Patent No.: US 6,509,386 B1
(45) Date of Patent: Jan. 21, 2003

(54) POROUS INSULATING COMPOUNDS AND METHOD FOR MAKING SAME

(75) Inventor: Paul A. Kohl, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/544,638

(22) Filed: Apr. 5, 2000

Related U.S. Application Data

(62) Division of application No. 09/325,977, filed on Jun. 4, 1999, now Pat. No. 6,162,838.
(60) Provisional application No. 60/101,672, filed on Sep. 24, 1998, and provisional application No. 60/088,233, filed on Jun. 5, 1998.

(51) Int. Cl.$^7$ ................................................. C08J 9/02
(52) U.S. Cl. ......................... 521/77; 521/149; 521/150
(58) Field of Search ........................... 521/77, 149, 150

(56) References Cited

U.S. PATENT DOCUMENTS

| | | | |
|---|---|---|---|
| 3,933,772 A | 1/1976 | Takahashi et al. | 260/87.3 |
| 4,460,712 A | 7/1984 | Blizzard et al. | 521/92 |
| 4,923,678 A | 5/1990 | Benedickt et al. | 428/209 |
| 4,987,101 A | 1/1991 | Kaanta et al. | 437/228 |
| 5,011,730 A | 4/1991 | Temmeu et al. | 428/209 |
| 5,049,632 A | 9/1991 | Asrar | 526/262 |
| 5,103,288 A | 4/1992 | Sakamoto et al. | 357/71 |
| 5,117,327 A | 5/1992 | Asrar et al. | 361/323 |
| 5,135,595 A | 8/1992 | Acocella et al. | 156/89 |
| 5,139,851 A | 8/1992 | Acocella et al. | 428/209 |
| 5,139,852 A | 8/1992 | Baose et al. | 428/209 |
| 5,180,754 A | 1/1993 | Morita et al. | 521/85 |
| 5,266,126 A | 11/1993 | Deguchi | 136/256 |
| 5,274,026 A | 12/1993 | Bemedikt et al. | 524/553 |
| 5,277,725 A | 1/1994 | Acocella et al. | 156/89 |
| 5,324,683 A | 6/1994 | Fitch et al. | 438/65 |
| 5,358,975 A | 10/1994 | Anderson | 521/77 |
| 5,461,003 A | 10/1995 | Havemann et al. | 437/187 |
| 5,468,819 A | 11/1995 | Goodall et al. | 426/171 |
| 5,508,542 A | 4/1996 | Geiss et al. | 257/301 |
| 5,569,711 A | 10/1996 | Yamamoto et al. | 525/66 |
| 5,585,433 A | 12/1996 | Yamamoto et al. | 525/66 |
| 5,635,019 A | 6/1997 | Geiss et al. | 438/386 |
| 5,679,444 A | 10/1997 | Davis et al. | 428/209 |
| 5,681,900 A | 10/1997 | Murakami et al. | 525/339 |
| 5,700,844 A | 12/1997 | Hedrick et al. | 521/77 |
| 5,709,805 A | 1/1998 | Davis et al. | 216/18 |
| 5,744,399 A | 4/1998 | Rostoker et al. | 438/622 |
| 5,756,021 A | 5/1998 | Hedrick et al. | 264/45.1 |
| 5,767,014 A | 6/1998 | Hawker et al. | 438/623 |
| 5,773,197 A | 6/1998 | Carter et al. | 430/313 |
| 5,776,990 A * | 7/1998 | Hedrick et al. | 521/77 |
| 5,869,880 A | 2/1999 | Grill et al. | 257/522 |
| 5,883,219 A * | 3/1999 | Carter et al. | 528/310 |
| 5,895,263 A * | 4/1999 | Carter et al. | 438/624 |
| 5,953,627 A | 9/1999 | Carter et al. | 438/623 |
| 5,962,113 A * | 10/1999 | Brown et al. | 428/209 |
| 6,093,636 A * | 7/2000 | Carter et al. | 438/623 |

FOREIGN PATENT DOCUMENTS

| | | |
|---|---|---|
| EP | 445755 | 6/1991 |
| EP | 0936230 | 10/1997 |
| EP | 881668 | 5/1998 |
| JP | 63099206 | 10/1986 |
| WO | 9720871 | 12/1997 |

OTHER PUBLICATIONS

PCT International Search Report, for application No. PCT/US99/12467 dated May 6, 1998.
IBM Technical Dicslosure Bulletin, Low Dielectric Constant Inorganic Insulators For BEOL And Packaging Applications, vol. 37.
IBM Technical Disclosure Bulletin, Reduced Capacitance Interconnect System Using Decomposition Of Air Gap Filler Material, Sep. 1995.
Materials Research Society, Controlling Porosity In Bridged Polysilsequioxanes Through Elimination Reactions, vol. 435, p. 277–282.
IEEE Transactions on Electron Devices, Use Of As Low–K Interlayer Dielectric In LSI's: Deomonstration Of Feasibility, vol. 44, No. 11, Nov. 1997 p. 1–7.
IEE Electron Device Letters, Air–Gap Formation During IMD Deposition To Lower Interconnect Capacitance, vol. 19, No. 1, Jan. 1998 p. 1–3.
Electrochemical and Solid–State Letters, Low k, Porous Methyl Silsequioxane And Spin–On–Glass, 1999, p. 77–79.
Technology News, Wafer Processing, The New Low –k Candidate: It's a Gas, Mar. 1998.
Materials Research Society, Symposium Proceedings, Low–Dielectric Constant Materials IV, vol. 511, 1998.
Advanced Materials, Research News, Templating Nanoporosity In Thin–Film Dielectric Insulators, 1998, p. 1049–1053.
Deposition, Air Gaps Lower k Of Interconnect Dielectrics, Feb. 1999, p. 51–58.

* cited by examiner

*Primary Examiner*—Morton Foelak
(74) *Attorney, Agent, or Firm*—Renner, Otto, Boisselle & Sklar, LLP

(57) ABSTRACT

A method of forming a porous insulating composition comprising the steps of (A) providing at least one organic sacrificial material/dielectric material composition comprising at least one organic sacrificial material and at least one dielectric material; and (B) removing the at least one organic sacrificial material in the at least one organic sacrificial material/dielectric material composition, in order to generate pores in the at least one dielectric material. Also disclosed is a composition useful in making a porous insulator, comprising a heat-activated, pore-forming, sacrificial material; and a dielectric material. Alternatively, the composition useful in making a porous insulator, comprises at least one pore-forming, organic sacrificial material; and at least one dielectric material, wherein the at least one pore-forming, material is a norbornene-type polymer.

21 Claims, 5 Drawing Sheets

POROUS INSULATING COMPOUNDS AND METHOD FOR MAKING SAME

RELATED APPLICATION DATA

This application is a divisional of U.S. Ser. No. 09/325,977, filed on Jun. 4, 1999, which is now U.S. Pat. No. 6,162,838, which claims priority from previously filed U.S. Provisional Application No.60/088,233, filed on Jun. 5, 1998, entitled "in organic and Organic Insulating Foams"; U.S. Provisional Application No. 60/101,672, filed on Sep. 24, 1998, entitled "Improved Inorganic and Organic Insulating Foams", both of which are hereby incorporated herein by reference in their entireties.

FIELD OF THE INVENTION

The invention herein described relates generally to a method for forming a porous insulating article (or composition or compound), and more specifically to the compounds used in the process to make the same.

BACKGROUND OF THE INVENTION

As a consequence of the progress made in integrated circuit technology, the spacing between the metal lines on any given plane of an integrated circuit has become less and less, now extending into the submicrometer range. By reducing the spacing between conductive members in the integrated circuit, an increase in capacitive coupling occurs. This increase in capacitive coupling causes greater crosstalk, higher capacitive losses and increased resistor capacitor (RC) time constant.

Inorganic materials such as silicon dioxide and silicon nitride have been traditionally used in the microelectronics industry as insulating and passivating materials in the manufacture of integrated circuits. However, as the demand for smaller, faster, and more powerful devices becomes prevalent new materials will be needed to enhance the performance and the efficient manufacture of these devices.

To meet these enhanced performance and manufacturing criteria, considerable interest in high performance polymers characterized by low dielectric constant, low moisture uptake, good substrate adhesion, chemical resistance, high glass transition temperatures (e.g., $T_g>250°$ C.), toughness, high thermal and thermal-oxidative stabilities, as well as good optical properties are increasingly gaining momentum. Such polymers are useful as dielectric coatings and films in the construction and manufacture of multichip modules (MCMs) and in integrated circuits (IC), in electronic packaging, in flexible film substrates, and in optical applications such as in flat panel displays and the like.

In order to reduce capacitive coupling, much effort has been directed toward developing low dielectric constant (low-K) materials to replace conventional dielectric materials that are interposed between the metal lines on a given layer and between layers. Many conventional electronic insulators have dielectric constants ($\in$) in the 3.5 to 4.2 range. For example, silicon dioxide has a dielectric constant of 4.2 and polyimides typically have dielectric constants from 2.9 to 3.5. Alternatively, the silicon dioxide can be decreased by adding fluorine in place of oxygen to yield a substance with a dielectric constant of approximately 3.5. Some advanced polymers have dielectric constants in the 2.5 to 3.0 range. Materials in the 1.8 to 2.5 range are also known, but such materials have had associated therewith severe processing, cost and materials problems.

The lowest possible, or ideal, dielectric constant is 1.0, which is the dielectric constant of a vacuum. Air is almost as good with a dielectric constant of 1.001. With this recognition of the low dielectric constant of air, attempts have been made to fabricate semiconductor devices using porous materials as an insulator. Thus, by incorporating air, the dielectric constant of a substance can be lowered.

For example, porosity can be added to silicon dioxide to decrease its effective dielectric constant. Thus, if 50 percent of the volume of a dielectric is air, the effective dielectric constant of the porous silicon dioxide can be calculated by multiplying the percentage of the total volume of the porous dielectric that is air (i.e., 50 percent) times the dielectric of air (1.001 or for ease of calculation 1) and add to it the percentage of the total volume of the porous dielectric that is, for example, silicon dioxide ($\in$=4). Thus, for s 50/50 mix of silicon dioxide and air the dielectric constant of the porous material is as follows: $\in$=0.5*4+0.5*1=2.5. Porous materials, such as the one described above, can be made up with as high as 90 percent air. However, such porous materials suffer from a number of drawbacks, such as, for example, a lack of mechanical and reliability attributes.

Another solution to lowering the dielectric constant of silicon dioxide is to use a spin-on-glass (SOG), which is generally a siloxane based material of low molecular weight, to lower the effective dielectric constant of silicon dioxide. The SOG is heat treated after deposition thereby completing a network of chemical bonds. This creates a "cage structure" of SOG and makes the density of the SOG less than that of silicon dioxide. As a result the dielectric constant of the SOG is lower than that of just silicon dioxide. However, such a reduction in the dielectric constant of a substance can be insufficient for some newer electrical applications, for example, high speed integrated circuits.

SUMMARY OF THE INVENTION

The present invention provides a method of forming a porous insulating composition comprising the steps of (A) providing at least one organic sacrificial material/dielectric material composition comprising at least one organic sacrificial material and at least one dielectric material; and (B) removing the at least one organic sacrificial material in the at least one organic sacrificial material/dielectric material composition, in order to generate pores in the at least one dielectric material. Additionally, step (B) can comprise heating the at least one organic sacrificial material to a temperature equal to or greater than the decomposition temperature of the at least one organic sacrificial material.

In another embodiment, the present invention provides a method of forming a porous insulating composition comprising the steps of: (A) providing a sacrificial material/dielectric material composition comprising at least one sacrificial material and at least one dielectric material; (B) curing the sacrificial material/dielectric material composition; and (C) thermally decomposing the at least one sacrificial material in the sacrificial material/dielectric material composition, in order to generate pores in the at least one dielectric material.

According to another aspect of the invention, a composition useful in making a porous insulator, comprising a heat-activated, pore-forming, sacrificial material; and a dielectric material is disclosed.

According to still another aspect of the invention, a composition useful in making a porous insulator, comprising at least one pore-forming, organic sacrificial material; and at least one dielectric material, wherein the at least one pore-forming, material is a norbornene-type polymer is disclosed.

Preferably, the organic sacrificial material or sacrificial material is a norbornene-type polymer. Also, the norbornene-type polymer preferably is of the type herein described, which comprises repeating units of the general formula:

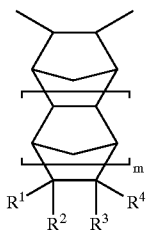

I wherein $R^1$ and $R^4$ independently represent hydrogen or linear or branched ($C_1$ to $C_{20}$) alkyl; $R^2$ and $R^3$ independently represent hydrogen, linear or branched ($C_1$ to $C_{20}$) alkyl or the groups:

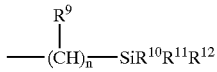

Ia $R^9$ independently is hydrogen, methyl, or ethyl; $R^{10}$, $R^{11}$, and $R^{12}$ independently represent linear or branched ($C_1$ to $C_{20}$) alkyl, linear or branched ($C_1$ to $C_{20}$) alkoxy, linear or branched ($C_1$ to $C_{20}$) alkyl carbonyloxy, and substituted or unsubstituted ($C_6$ to $C_{20}$) aryloxy; m is a number from 0 to 4; and n is a number from 0 to 5; and at least one of substituents $R^2$ and $R^3$ is selected from the silyl group represented by the formula set forth under Ia.

More generally, the organic sacrificial materials or sacrificial materials useful in practicing the present invention preferably encompass homopolymers and copolymers containing random repeating units derived from a monomer unit or monomer units represented by Formula I, or homopolymers or copolymers containing random repeating units derived from monomer unit or units represented by the below set forth Formula II, homopolymers or copolymers containing repeating units derived from a monomer unit(s) represented by below set forth Formula III and copolymers comprising a combination of repeating units represented by Formulae I and II, Formulae I and III, Formulae II and III or Formulae I, II and III.

The present invention is advantageous in that it provides a method by which uniformly dispersed pores of relatively the same pore diameter can be created in an insulating material, thereby reducing the dielectric constant of a insulating material.

The foregoing and other features of the invention are hereinafter fully described and particularly pointed out in the claims, the following description and the annexed drawings setting forth in detail one or more illustrative embodiments of the invention, such being indicative, however, of but one or a few of the various ways in which the principles of the invention may be employed.

BRIEF DESCRIPTION OF THE DRAWINGS

FIG. 2, line B depicts the infrared spectra of the porous insulating composition depicted in FIG. 2, line A after the sample has been subjected to a decomposition temperature of 400° C.

FIG. 2, line C depicts the infrared spectra of the porous insulating composition depicted in FIG. 2, line A after the sample has been subjected to a decomposition temperature of 425° C.

DETAILED DESCRIPTION OF PREFERRED EMBODIMENTS

Figure 1A:
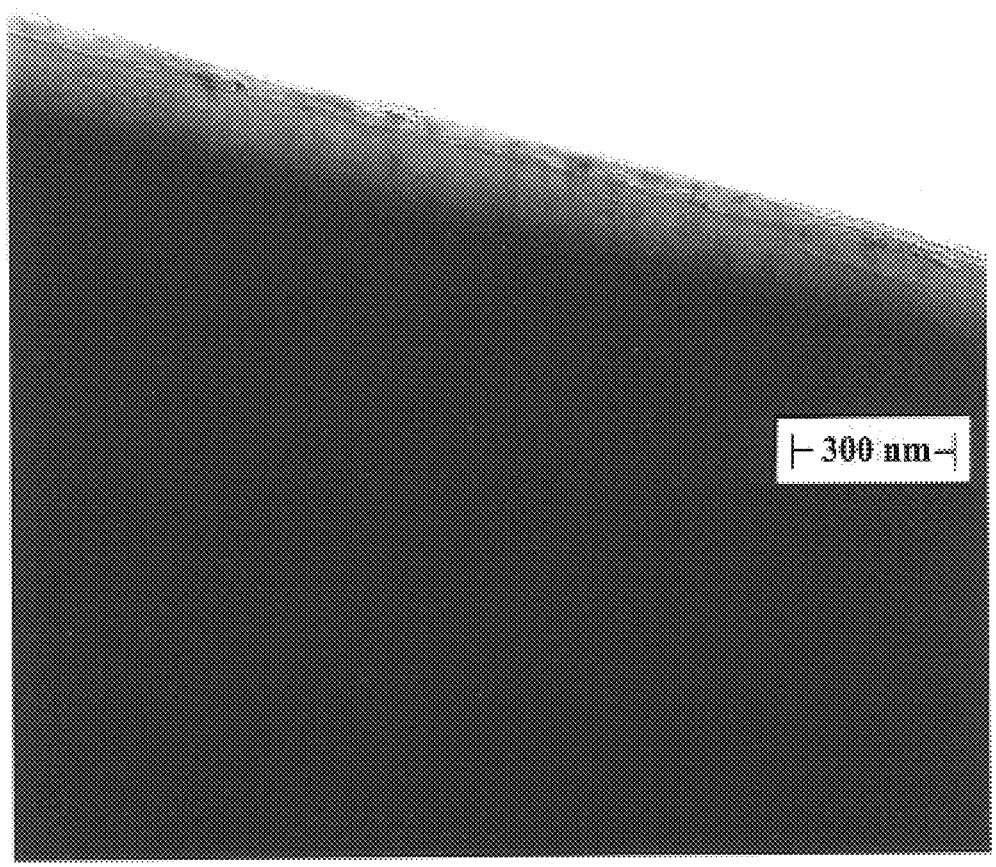
FIG. 1A is a micrograph depicting the absence of pores in a conventional spin-on dielectric insulating composition.

As used herein, sacrificial material means any material which is mixed with a dielectric material which, upon being subjected to the proper conditions, decomposes to form pores in the dielectric material. A pore is defined as a void within the dielectric material in which the void contains either a gas, a combination of gases, air or a vacuum. Preferably, the pores are either substantially spherical or elliptical in shape. Also, a used herein, a dielectric material is a material which is used as an insulator (e.g., $SiO_2$). The term heat-activated sacrificial material, as used herein, is used to denote a compound which upon exposure to heat decomposes leaving behind pores.

As stated above, the present invention relates to porous insulating compounds that have low dielectric constants (e.g. compounds having dielectric constants of less than about 4). Generally, the porous insulating compounds are formed from a combination of a dielectric material, such as a spin-on dielectric, with a sacrificial material. Preferably, the spin-on dielectric is as a spin-on polymer or spin-on-glass (SOG) (e.g., methylsilsesquioxane (MSQ), hydrogen-silsesquioxane (HSQ), or a mixed silsesquioxane) and the sacrificial material is an organic sacrificial material. With regard to a method for forming the above-mentioned porous insulating compounds, preferably a sacrificial material/dielectric material composition is formed by mixing a sacrificial material with a dielectric material. The sacrificial material is then removed from the composition via a suitable technique (e.g., by heating the composition to a temperature at or above the decomposition temperature of the sacrificial material), thereby creating pores.

More preferably, the decomposition reaction of the sacrificial material is induced solely by high temperature although other means may be used. The decomposition temperature should be compatible with the various components of the structure so as not to destroy the integrity thereof aside from the removal of the sacrificial material to form the pores. Typically, such temperature should be less than about 500° C. for electrical interconnect devices and more preferably less than 450° C. It is contemplated that the decomposition temperature will fall in the range of about 380° C. to about 450° C., although materials having decomposition temperatures as low as about 150° C. may be beneficial. The sacrificial material, however, should be sufficiently thermally stable so that the permanent material can be processed to a condition where it is electrically and/or mechanically stable.

The preferred sacrificial material for carrying out the above-described method preferably is a olefin or a polymer. More preferably, such an olefin or polymer is selected from the cycloolefin class of compounds and even more preferably is a bicycloolefin with a norbornene-type polymer being most preferred. Even further still, the sacrificial material can be a homopolymers and copolymers.

Sacrificial Material

By norbornene-type polymer is meant polycyclic addition homopolymers and copolymers comprising repeating units set forth under Formulae I, II and III below. Copolymers useful in practicing the invention can include repeating units selected from the group comprising and/or consisting of Formulae I, II and III, or combinations thereof. The norbornene-type polymer that is particularly useful as the sacrificial material in the present invention is sold under the Avatrel® trademark by The B F Goodrich Company, Akron, Ohio. The polymer comprises silyl substituted repeating units represented by the structure set forth under Formula I below.

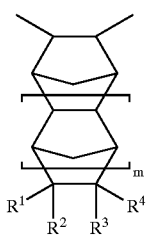

I wherein $R^1$ and $R^4$ independently represent hydrogen; linear or branched ($C_1$ to $C_{20}$) alkyl; $R^2$ and $R^3$ independently represent hydrogen, linear or branched ($C_1$ to $C_{20}$) alkyl or the group:

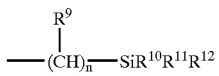

Ia $R^9$ independently is hydrogen, methyl, or ethyl; $R^{10}$, $R^{11}$, and $R^{12}$ independently represent linear or branched ($C_1$ to $C_{20}$) alkyl, linear or branched ($C_1$ to $C_{20}$) alkoxy, linear or branched ($C_1$ to $C_{20}$) alkyl carbonyloxy (e.g., acetoxy), and substituted: or unsubstituted ($C_6$ to $C_{20}$) aryloxy; m is a number from 0 to 4; and n is a number from 0 to 5. In Formula I at least one of substituents $R^2$ and $R^3$ must be selected from the silyl group represented by the formula set forth under Ia.

Preferably, at least one of $R^{10}$, $R^{11}$, or $R^{12}$ is selected from a linear or branched ($C_1$ to $C_{10}$) alkoxy group and $R^9$ is hydrogen. More preferably, each of $R^{10}$, $R^{11}$, and $R^{12}$ are the same and are selected from methoxy, ethoxy, propoxy, butoxy, and pentoxy. Most preferably, n is 0 and $R^{10}$, $R^{11}$, and $R^{12}$ are each ethoxy groups, e.g., $R^2$ and/or $R^3$ is most preferably a triethoxysilyl substituent. When n is 0, it is evident that the silyl functionality is connected directly to the polycyclic ring through a silicon-carbon bond wherein the carbon atom of the silicon-carbon bond is supplied by a carbon atom on the polycyclic ring (i.e., a ring carbon atom).

In Formula I above, m is preferably 0 or 1 as represented by structures Ib and Ic, respectively, below:

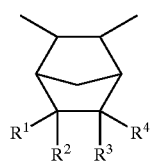

Ib

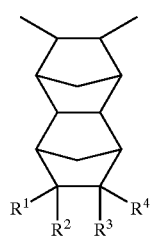

Ic wherein $R^1$ to $R^4$ are as previously defined and at least one of $R^2$ and $R^3$ must be a silyl substituent represented by Ia. Repeating units where m is 0, i.e., repeating units of structure Ib, are especially preferred.

In Formulae I, Ib, and Ic $R^1$ and $R^4$ can taken together with the two ring carbon atoms to which they are attached to represent a saturated cyclic group of 4 to 8 carbon atoms. When $R^1$ and $R^4$ are taken together to form a saturated cyclic group, the cyclic group is substituted by $R^2$ and $R^3$ at least one of which must be a silyl group represented by Ia. Generically such monomers are represented by the following structure:

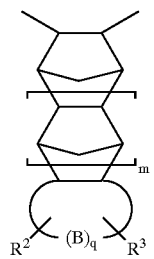

wherein B is a methylene (i.e., —CH$_2$—) group and q is a number from 2 to 6. It should be apparent that when the methylene group represented by B contains an $R^2$ or $R^3$ substituent, one of the hydrogen atoms of the —CH$_2$— group is replaced by the $R^2$ or $R^3$ substituent. Representative repeating unit structures are set forth below:

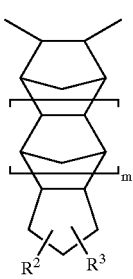

-continued

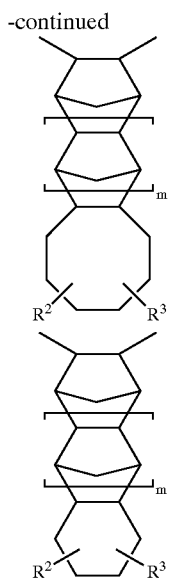

wherein R², R³, and m are as previously defined.

Illustrative examples of monomers of Formula I include 5-triethoxysilyl-norbornene, 5-trimethylsilyl norbornene, 5-trimethoxysilyl norbornene, 5-methyldimethoxysilyl norbornene, 5-dimethylmethoxy norbornene.

In another embodiment of the present invention, the sacrificial polymer comprises hydrocarbyl substituted polycyclic repeating units selected from units represented by Formula II below:

II

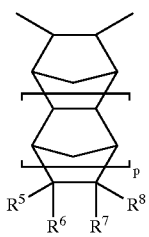

wherein $R^5$, $R^6$, $R^7$, and $R^8$ independently represent hydrogen, linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl, or vinyl; any of $R^5$ and $R^6$ or $R^7$ and $R^8$ can be taken together to form a ($C_1$ to $C_{10}$) alkylidenyl group, $R^5$ and $R^8$ when taken with the two ring carbon atoms to which they are attached can represent saturated and unsaturated cyclic groups containing 4 to 12 carbon atoms or an aromatic ring containing 6 to 17 carbon atoms; and p is 0, 1, 2, 3, or 4. The hydrocarbyl substituents on the foregoing substituents are composed solely of carbon and hydrogen atoms, such as, for example, branched and unbranched ($C_1$ to $C_{10}$) alkyl, branched and unbranched ($C_2$ to $C_{10}$) alkenyl, and ($C_6$ to $C_{20}$) aryl.

Illustrative examples of hydrocarbyl substituted monomers include 2-norbornene, 5-methyl-2-norbornene, 5-hexyl-2-norbornene, 5-cyclohexyl-2-norbornene, 5-cyclohexenyl-2-norbornene, 5-butyl-2-norbornene, 5-ethyl-2-norbornene, 5-decyl-2-norbornene, 5-phenyl-2-norbornene, 5-naphthyl-2-norbornene 5-ethylidene-2-norbornene, vinylnorbornene, dicyclopentadiene, dihydrodicyclopentadiene, tetracyclododecene, methyltetracyclododecene, tetracyclododecadiene, dimethyltetracyclododecene, ethyltetracyclododecene, ethylidenyl tetracyclododecene, phenyltetracyclododecene, trimers of cyclopentadiene (e.g., symmetrical and asymmetrical trimers). An especially preferred hydrocarbyl repeating unit is derived from 2-norbornene.

In another embodiment of the invention, a sacrificial polymer useful in carrying out the invention comprises repeating units represented by Formula III below:

III

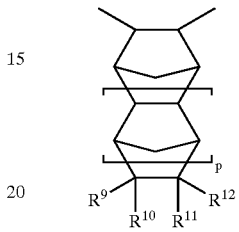

wherein $R^9$ to $R^{12}$ independently represent a polar substituent selected from the group: —(A)$_n$—C(O)OR", —(A)$_n$—OR", —(A)$_n$—OC(O)R", —(A)$_n$—OC(O)OR", —(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$. The moieties A and A' independently represent a divalent bridging or spacer radical selected from divalent hydrocarbon radicals, divalent cyclic hydrocarbon radicals, divalent oxygen containing radicals, and divalent cyclic ethers and cyclic diethers, and n is an integer 0 or 1. When n is 0 it should be apparent that A and A' represent a single covalent bond. By divalent is meant that a free valence at each terminal end of the radical are attached to two distinct groups. The divalent hydrocarbon radicals can be represented by the formula —($C_dH_{2d}$)— where d represents the number of carbon atoms in the alkylene chain and is an integer from 1 to 10. The divalent hydrocarbon radicals are preferably selected from linear and branched ($C_1$ to $C_{10}$) alkylene such as methylene, ethylene, propylene, butylene, pentylene, hexylene, heptylene, octylene, nonylene, and decylene. When branched alkylene radicals are contemplated, it is to be understood that a hydrogen atom in the linear alkylene chain is replaced with a linear or branched ($C_1$ to $C_5$) alkyl group.

The divalent cyclic hydrocarbon radicals include substituted and unsubstituted ($C_3$ to $C_8$) cycloaliphatic moieties represented by the formula:

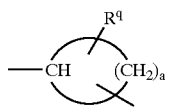

wherein a is an integer from 2 to 7 and $R^q$ when present represents linear and branched ($C_1$ to $C_{10}$) alkyl groups. Preferred divalent cycloalkylene radicals include cyclopentylene and cyclohexylene moieties represented by the following structures:

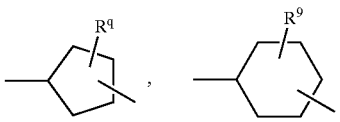

wherein $R^q$ is defined above. As illustrated here and throughout this specification, it is to be understood that the bond lines projecting from the cyclic structures and/or formulae represent the divalent nature of the moiety and indicate the points at which the carbocyclic atoms are bonded to the adjacent molecular moieties defined in the respective formulae. As is conventional in the art, the diagonal bond line projecting from the center of the cyclic structure indicates that the bond is optionally connected to any one of the carbocyclic atoms in the ring. It is also to be understood that the carbocyclic atom to which the bond line is connected will accommodate one less hydrogen atom to satisfy the valence requirement of carbon.

Preferred divalent cyclic ethers and diethers are represented by the structures:

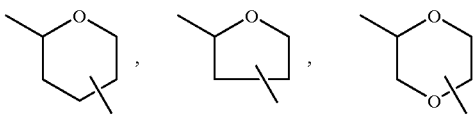

The divalent oxygen containing radicals include ($C_2$ to $C_{10}$) alkylene ethers and polyethers. By ($C_2$ to $C_{10}$) alkylene ether is meant that the total number of carbon atoms in the divalent ether moiety must at least be 2 and can not exceed 10. The divalent alkylene ethers are represented by the formula -alkylene-O-alkylene- wherein each of the alkylene groups that are bonded to the oxygen atom can be the same or different and are selected from methylene, ethylene, propylene, butylene, pentylene, hexylene, heptylene, octylene, and nonylene. The simplest divalent alkylene ether of the series is the radical —$CH_2$—O—$CH_2$—. Preferred polyether moieties include divalent radicals of the formula:

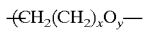

wherein x is an integer from 0 to 5 and y is an integer from 2 to 50 with the proviso that the terminal oxygen atom on the polyether spacer moiety can not be directly linked to a terminal oxygen atom on an adjacent group to form a peroxide linkage. In other words, peroxide linkages (i.e., —O—O—) are not contemplated when polyether spacers are linked to any of the terminal oxygen containing substituent groups set forth under $R^9$ to $R^{12}$ above.

$R^9$ to $R^{12}$ can also independently represent hydrogen, linear and branched ($C_1$ to $C_{10}$) alkyl, so long as at least one of the remaining $R^9$ to $R^{12}$ substituents is selected from one of the polar groups represented above. In the formula above p is an integer from 0 to 5 (preferably 0 or 1, more preferably 0). R" independently represents hydrogen, linear and branched ($C_1$ to $C_{10}$) alkyl (e.g., —C($CH_3$)), —Si($CH_3$), —CH($R^p$)OCH$_2$CH$_3$, —CH($R^p$)OC($CH_3$)$_3$, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters (lactones). By ($C_1$ to $C_{10}$) alkoxyalkylene is meant that a terminal alkyl group is linked through an ether oxygen atom to an alkylene moiety. The radical is a hydrocarbon based ether moiety that can be generically represented as -alkylene-O-alkyl wherein the alkylene and alkyl groups independently contain 1 to 10 carbon atoms each of which can be linear or branched. The polyether radical can be represented by the formula:

wherein x is an integer from 0 to 5, y is an integer from 2 to 50 and $R^a$ represents hydrogen or linear and branched ($C_1$ to $C_{10}$) alkyl. Preferred polyether radicals include poly(ethylene oxide) and poly(propylene oxide). Examples of monocyclic cycloaliphatic monocyclic moieties include cyclopropyl, cyclobutyl, cyclopentyl, cyclohexyl, dicyclopropylmethyl (Dcmp) and dimethylcyclopropylmethyl (Dmcp), and the like. Examples of cycloaliphatic polycyclic moieties include, norbornyl, adamantyl, tetrahydrodicyclopentadienyl (tricyclo[5.2.1.0$^{2.6}$] decanyl), and the like. Examples of cyclic ethers include tetrahydrofuranyl and tetrahydropyranyl moieties. An example of a cyclic ketone is a 3-oxocyclohexanonyl moiety. An example of a cyclic ester or lactone is a mevalonic lactonyl moiety. Structures for representative cyclic groups set forth above include:

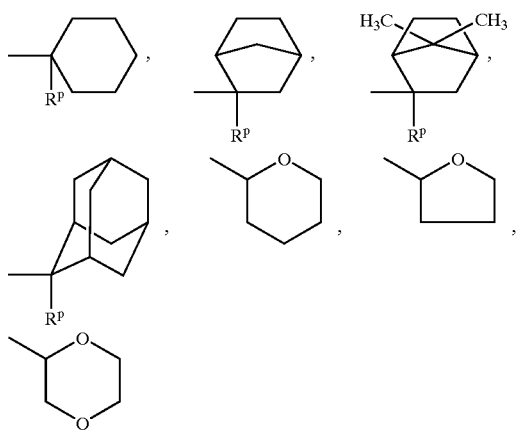

wherein $R^p$ in the above formulae and cyclic groups represents hydrogen or a linear or branched ($C_1$ to $C_5$) alkyl group. The Dcpm and Dmcp substituents are represented, respectively, as follows:

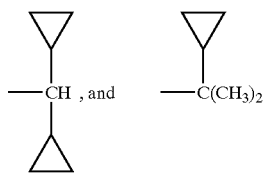

The sacrificial polymers useful in practicing the present invention preferably encompass homopolymers and copolymers containing random repeating units derived from a monomer unit or monomer units represented by Formula I, or homopolymers or copolymers containing random repeating units derived from monomer unit or units represented by Formula II, homopolymers or copolymers containing repeating units derived from a monomer unit(s) represented by Formula III and copolymers comprising a combination of repeating units represented by Formulae I and II, Formulae I and III, Formulae II and III or Formulae I, II and III.

Preferred sacrificial polymers according to the present invention may contain from about 0.1 to 100 mole percent of silyl functional polycyclic repeating units, preferably from about 1 to 50 mole percent, more preferably from about 3 to 25 mole percent, and most preferably from about 5 to 20 mole percent, with the remainder of the polymer preferably comprising repeating units described under Formula II and/or Formula III. An especially preferred polymer comprises repeating units polymerized from norbornene and triethoxysilylnorbonene in a mole percent ratio of 80/20 norbornene/triethoxysilylnorbonene.

Preferred sacrificial polymers according to present invention are addition polymers comprising polycyclic repeating units that are connected to one another via 2,3-linkages that are formed across the double bond contained in the norbornene-type moiety of the prepolymerized polycyclic monomer.

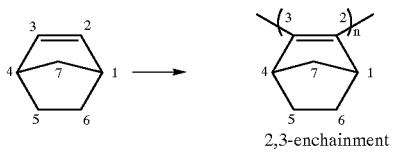

2,3-enchainment

The polymers may be polymerized from appropriately functionalized norbornene-type monomers in the presence of a single or multi-component Group VIII transition metal catalyst system as described in International Patent Application Publication No. WO 97/20871 to The BFGoodrich Company, published on Jun. 12, 1997, which is hereby incorporated herein by reference in its entirety.

The polynorbornene-type polymer is particularly beneficial because it has a high (>350° C.) and sufficient thermal stability to accommodate a number of commonly employed and other semiconductor manufacturing steps such as plasma enhanced chemical vapor deposition (PECVD) of $SiO_2$ and low temperature copper annealing, and has a decomposition temperature close to its $T_g$, thereby limiting movement which might damage the semiconductor device.

It is believed that the polycycloolefinic polymers utilized in practicing this invention are uniquely suited as sacrificial materials in semiconductor device manufacturing because the material thermally decomposes close to its $T_g$. In other words, the polymer remains mechanically stable until the decomposition temperature is reached enabling the polymer to endure the rather harsh processing steps (e.g., repeated heat cycles, the mechanical stress of manipulation, etc.) during semiconductor manufacture. The disadvantage with the prior art polymers is that their $T_g$'s are well below their decomposition temperatures, leading to mechanical failure or structural changes before the decomposition temperature is reached.

It has been found that by incorporating polycycloolefinic repeating units that contain pendant hydrocarbyl (Formula II) and/or pendant polar (Formula III) substituents into the sacrificial polymer backbone the decomposition temperatures of the silyl substituted polycycloolefinic polymer can be significantly lowered. The decomposition temperature of polymers containing 80/20 mole percent of norbornene/triethoxysilylnorbonene (decomposition temperature approximately 430° C.) can be lowered by approximately 30° C. by replacing the norbornene repeating units in the copolymer with repeating units containing pendant linear and/or branched ($C_1$ to $C_{20}$) alkyl substituents. For example, the thermal decomposition temperature for a copolymer containing butylnorbornene/triethoxysilylnorbornene in a mole percent ratio of 95/5 is lowered to 405° C. We expect that the decomposition temperature of the copolymer can be lowered even further (up to approximately 100° C.) by replacing the norbornene repeating units in the copolymer with repeating units containing the polar substituents described under Formula III. Homopolymers of norbornyl acetate and norbornyl ethyl carbonate have thermal decomposition temperatures of 356° C. and 329° C., respectively. The polar groups include ester, carbonate, and acetate substituents and the like. To effect lower decomposition temperatures of the silyl substituted polymers, the polymer should contain about 50 mole percent of polycyclic repeating units having pendant hydrocarbyl or polar functionality, preferably greater than 50 mole percent, more preferably 51 to 99 percent, still more preferably 55 to 95 mole percent, even more preferably 65 to 80 mole percent.

The aforesaid sacrificial polymers can be heated to above their decomposition temperature, typically in the range of about 380° C. to about 450° C., to cause the polymers to decompose into their decomposition products which can diffuse through the various materials the sacrificial polymers are mixed with. Such materials include polymer dielectrics such as silicon dioxide, silicon nitride, methylsilsesquioxane (MSQ), $CH_3SiO_{1.5}$, or hydrogensilsesquioxane (HSQ), $HSiO_{1.5}$. Particularly useful are polymers such as MSQ, HSQ and mixed silsesquioxanes, as will become evident from the following description of other exemplary methods illustrating other aspects of the invention.

In addition, it should also be noted that when the decomposition temperature of the sacrificial material is lowered spin-on polymers with lower curing temperatures can be utilized as the dielectric material.

Dielectric Material

Methods for making methylsilsesquioxane are known in the art. For example, it is known that methylsilsesquioxane can be formed by the hydrolysis of methyltriethoxysilane. Alternatively, it is also known from Rahn et al., *Mat. Res. Soc. Symp. Proc.*, (1990) v. 171:31–37, that a silsesquioxane copolymer can be produced through a catalytic redistribution reaction followed by a reaction with alcohols. Laine et al., *Chem. Mat.*, (1990), v. 2:464–472, teaches the synthesis of methylsilsesquioxane using a titanium-catalyzed redistribution of cyclomers or linear oligomers. Sugiyama et al., U.S. Pat. No. 4,745,169, teaches that a polyorganosilsesquioxane can be synthesized from a trichlorosilane or trialkoxysilane having a protected hydroxyl group. U.S. Pat. No. 4,745,169 is hereby incorporated herein by reference for its teachings of how to synthesize a polyorganosilsesquioxane.

Methods for making hydrogensilsesquioxane are also known in the art. For example, it is known to hydrolyze an alkoxy or acyloxy silane with water in an acidic, alcoholic hydrolysis medium. Similarly, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Additionally, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Of particular use are Accuspin® T-18 (a methylsilsesquioxane also know as Allied-Signal 418, from Allied-Signal, Santa Clara, Calif.) or Accuglass® 512 (a mixed silsesquioxane, also from Allied-Signal, Santa Clara, Calif.). Also of interest is a hydrogen silsesquioxane product from Dow Corning called flowable oxide $FO_x$.

Generally, the porous insulating compounds, preferably porous silsesquioxane insulating compounds, of the present invention are formed by mixing a sacrificial material, preferably selected from the cycloolefin class of compounds discussed above and more preferably selected from the bicycloolefins discussed above, with a dielectric material, such as a spin-on dielectric. Preferably, the spin-on dielectric is a spin-on polymer or spin-on-glass (SOG) (e.g., methylsilsesquioxane (MSQ), hydrogensilsesquioxane (HSQ), or mixed silsesquioxanes). Even more preferably, the sacrificial material is selected from one of the norbornene-type polymers discussed above and the spin-on dielectric is either Accuspin® T-18 or Accuglass® 512.

Preferably, the sacrificial material is first dissolved into a solvent (e.g., an organic solvent such as an organic alcohol) which is capable of dissolving at least one of either the sacrificial material and/or the dielectric material. The dissolved sacrificial material is then mixed with the dielectric material, thereby forming a solution. The resulting solution is stirred at room temperature for an appropriate length of time in order to ensure that the sacrificial material is evenly dispersed in the dielectric material. Preferably the above solution is stirred at room temperature for about 0.1 to about 4 hours, more preferably about 0.75 to about 3 hours, and even more preferably about 1 to about 2 hours. Even more preferably, the dissolved sacrificial material is filtered with a filter, having a pore size of about 0.2 μm, prior to being mixed with the dielectric material. Once stirring of the sacrificial polymer/dielectric material is completed, the mixture is then preferably filtered. The filter used at this stage preferably has a pore size of less than about 0.2 μm.

It should be noted, however, that other techniques for combining the sacrificial material with the dielectric material can be used. For example, the two could be combined used spraying.

Next, the sacrificial material/dielectric material composition, if so desired, can be deposited by a suitable technique onto a desired surface or article. Preferably, the composition is spin coated onto a desired surface. The composition is then subjected to a temperature sufficient enough to cure the dielectric material but not sufficient enough to cause decomposition of the sacrificial material. Thus, it is important that the dielectric material portion of the composition used in the present invention has a curing temperature which is at or below the decomposition temperature of the sacrificial material used in the present invention so that a stabilized polymer film can be formed which retains the porous nature of the sacrificial material once decomposition has occurred. In the case where the curing temperature is below the decomposition temperature of the sacrificial material, the cured mixture is next subjected to a temperature sufficient enough to cause the sacrificial material to undergo decomposition. The decomposition products of the sacrificial material are believed to permeate through the cage structure of the dielectric material, thereby leaving behind pores or voids.

Alternatively, the sacrificial material/dielectric material composition can be subjected to a temperature which is both sufficient enough to cure the dielectric material and sufficient enough to cause decomposition of the sacrificial material. That is, both steps may be conducted simultaneously by gradually heating the coated objects to a temperature that is at or above the decomposition temperature of the sacrificial material.

EXAMPLES

The following applies to all of the Examples discussed below, unless other wise specified.

In the Examples, unless otherwise stated, degrees are in Celsius, pressure in atmosphere and amounts and rations are given by weight.

Dielectric measurements were performed by fabricating parallel plate capacitors on (100) silicon wafers. The bottom plate of the capacitors was a full-surface film of sputtered Ti/Au/Ti (300 Å/4000 Å/300 Å). A homopolymer of triethoxysilylnorbornene (TESNB) was dissolved into 4-methyl-2-pentanone (Aldrich Chemical Co.) (up to 60% by weight, although higher concentrations can be used) followed by filtering with a 0.2 μm filter (Gelman Sciences) and mixing at room temperature for a suitable amount of time with either MSQ or HSQ solutions, also formed by dissolving the MSQ or HSQ in a suitable solvent (e.g., an organic alcohol such as 4-methyl-2-pentanone). After the mixing was completed, the combined solutions was filtered with a 0.2 μm filter (Gelman Sciences). Next the filter mixture was spin coated onto the metallized silicon substrates at 3000 RPM.

The spin coated materials were then baked at 180° C. in air for two minutes, followed by further curing and polymer decomposition in a nitrogen-purged, quartz tube oven. The temperature in the oven was raised at a rate of between about 1 to about 10° C./min, preferably about 2 to about 5° C./min, until the over temperature reached approximately 425° C., upon which the oven was held at this temperature for approximately 30 minutes. After which the coated substrates were cooled slowly by nature convection to less than 150° C.

After completion of the above process, a top electrode consisting of Ti/Au/Ti (100 Å/4000 Å/1000 Å) was patterned by photolithography and wet etching and the conductance of the capacitors were measured. The capacitors had a surface area in the range of from about 0.025 cm² to about 1.1 cm². The capacitance and conductance were measured at 10 kHz. Only defect-free capacitors with low conductances, generally below about 1 μS, and often below about 0.01 μS, were subjected to further testing as described below.

In view of the above, the permittivity and dielectric constant were found to be the same to generally three significant figures. No correction was necessary for fringing fields around the perimeter of the capacitors due to their high capacitor area-to-thickness ratio (>1000).

It should also be noted, that for the examples discussed below FT-IR spectra were obtained using a Nicolet 550 infrared spectrometer and that defect determination in the dielectric layers was accomplished using a Hitachi-2000 electron microscope.

Example 1

A mixture of 20% triethoxysilylnorbornene polymer (Mw=158,000, determined by GPC in monchlorobenzene) and 80% MSQ (Accuspin® T-18), by weight, was formed by dissolving each of the above components in an adequate amount 4-methyl-2-pentanone and then mixing the two solutions while stirring. The resulting solution was stirred one hour at room temperature in order to yield a sacrificial material/dielectric material composition. The resulting composition was then spin coated onto metallized silicon substrates to yield a dielectric layers having a thickness of about 620 nm. Thereafter, the coated metallized silicon substrates were subjected to optical microscopy to confirm that they were defect free and did not have any pinholes or through-voids present in the sacrificial material/dielectric material composition layer.

The sacrificial material/dielectric material composition coated metallized silicon substrates were then placed in an oven in which the temperature was raised at a rate of about 5° C./min, until the over temperature reached approximately 425° C., upon which the oven was held at this temperature for about 30 minutes. Initially, the dielectric material portion of the sacrificial material/dielectric material composition is cured by being subjected to heat. After the temperature in the oven reaches the approximate decomposition temperature of the sacrificial material in the sacrificial material/dielectric material composition, the sacrificial material undergoes decomposition.

After completion of the above process, the average dielectric constant of the dielectric layers formed according to this example was measured and found to be 2.31 with a standard deviation of 0.09.

Dielectric films of 40% triethoxysilylnorbornene polymer and 60% MSQ; and 60% triethoxysilylnorbornene polymer and 40% MSQ were also prepared in accordance with the above procedure. These films were also defect-free upon spin coating and substantially free from the formation of pinholes, through-voids or tubes (i.e., voids which connect to form a complete passage from one side of the dielectric layer to the other). Alternatively, a through-void may be defined as a channel or void which goes completely through a cross-section of the porous insulator.

It should be noted, that in order to produce a viable insulator layer, the method used for producing the porous insulative material should produce an insulator which is substantially free of pinholes or through-voids. Preferably, the insulator should be completely free of such pinholes or through-voids. This is because such pinholes or through-voids can lead to an increased in the conductivity of the insulator, thereby reducing its insulative capacity.

Comparative Example 1

The metallized silicon substrates of Comparative Example 1 were formed by the same process described above with regard to Example 1 except for the following. The dielectric layers were formed from only MSQ (Accuspin® T-18). The dielectric layers in this example were found to have a thickness of about 650 nm. The average dielectric constant of the dielectric layers of this example was measured and found to be 2.71, with a standard deviation of 0.05.

Example 2

The metallized silicon substrates of Example 2 were formed by the same process described above with regard to Example 1 that the dielectric layers were formed from 20% triethoxysilylnorbornene polymer and 80% Accuglass® 512. The final cure temperature for Example 2 was about 40° C. The average dielectric constant of the dielectric layers of this example were measured and found to be 2.71, with a standard deviation of 0.05.

Comparative Example 2

The metallized silicon substrates of Comparative Example 2 were formed by the same process described above with regard to Example 2 that the dielectric layers were formed from only Accuglass® 512. The average dielectric constant of the dielectric layers of this example was measured and found to be 3.1, with a standard deviation of 0.11.

The results of the above Examples are summarized below in Table I. It should be noted that lower dielectric constants are better in that a compound having a lower dielectric constant is a better insulator.

| Material | Dielectric Constant | Standard Deviation |
|---|---|---|
| Example 1 | 2.31 | 0.09 |
| Comparative Example 1 | 2.71 | 0.05 |
| Example 2 | 2.77 | 0.11 |
| Comparative Example 2 | 3.1 | 0.1 |

As can be seen from the results detailed in Table I, the dielectric constants of a dielectric material (e.g., a spin-on dielectric) can be lowered significantly by subjecting a mixture of a sacrificial material and a dielectric material to conditions sufficient to cause the decomposition of the sacrificial material.

The decrease in the dielectric constant between the comparative examples and the inventive examples can be attributed to the formation of pores in the dielectric layers upon subjecting the dielectric layers to conditions suitable to cause the decomposition of the sacrificial material. Norbornene polymers are preferred as sacrificial materials because they thermally decompose into volatile products which are able to diffuse through the dielectric material (or encapsulating film). It was also discovered that the sacrificial material, when mixed with a dielectric material in the manner described above, was found to be evenly dispersed throughout the dielectric material, thereby preventing the formation of pinholes or through-holes in the dielectric layer.

Figure 1B:
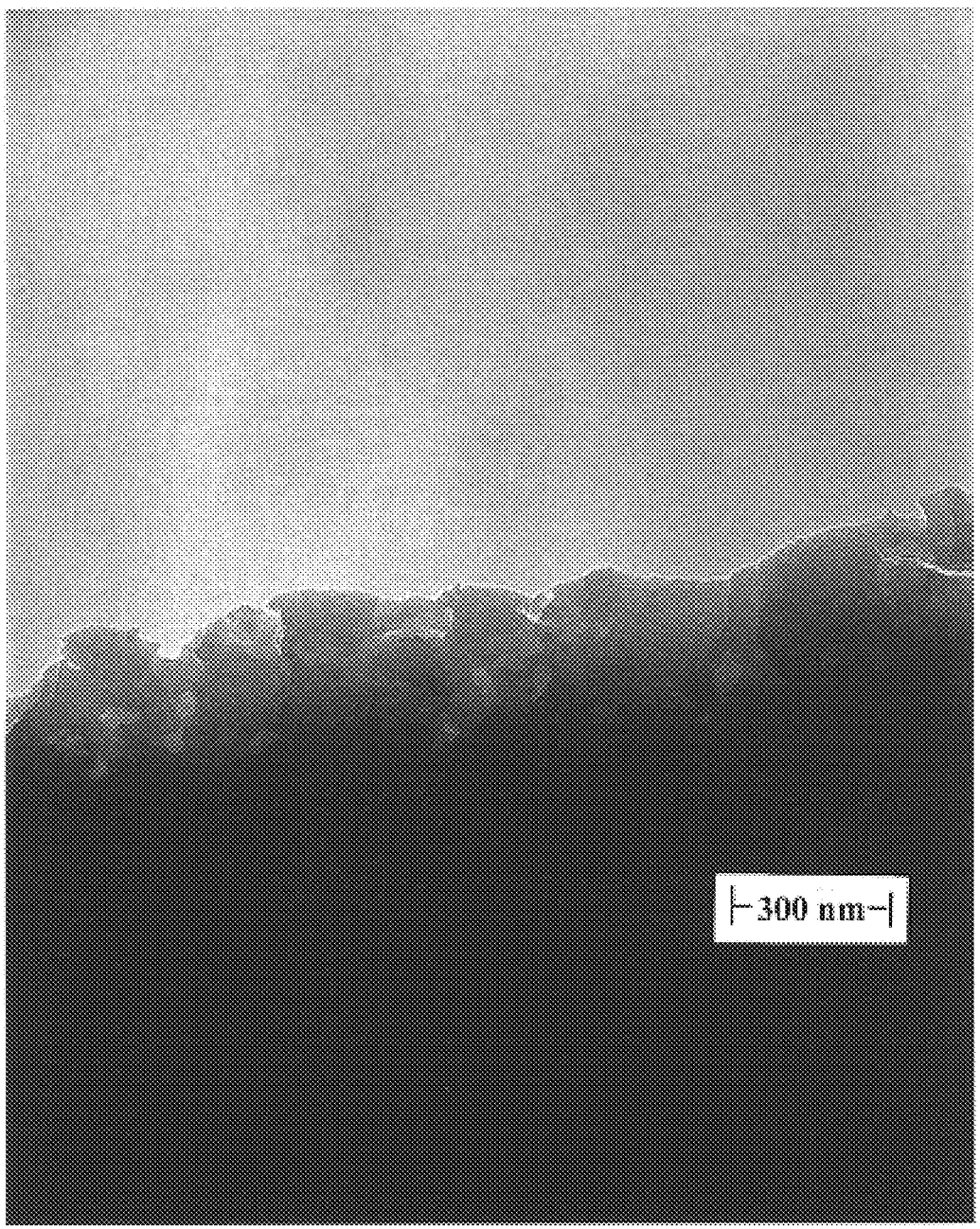
FIG. 1B is a micrograph depicting the presence and size of the pores formed in a porous insulating composition according to one embodiment of the present invention.
Figure 1C:
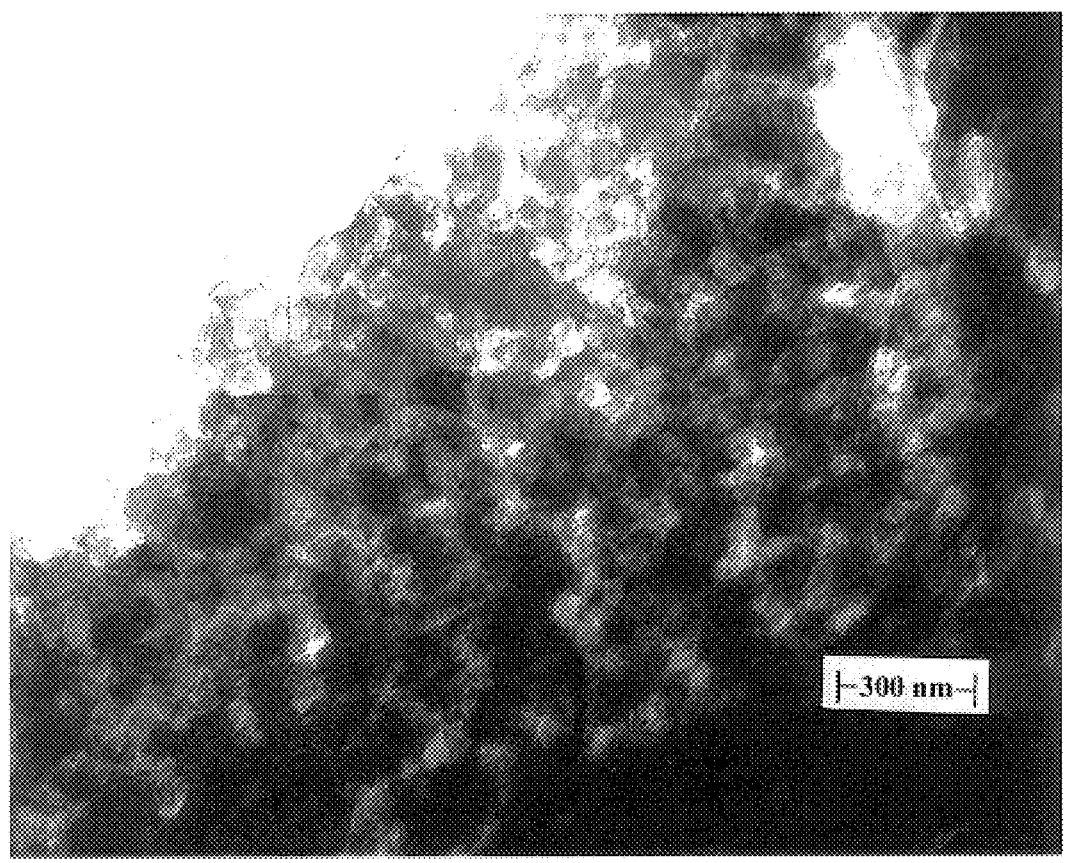
FIG. 1C is a micrograph depicting the presence and size of pores formed in a porous insulating composition according to another embodiment of the present invention.

Turning now to the Figures, FIG. 1A depicts a micrograph of a cured MSQ layer. The micrograph of shows that no pores were observed to have formed in a dielectric layer which contained only MSQ. On the other hand, as can be seen from the micrographs of FIGS. 1B (20%TESNB/80% MSQ by weight) and 1C (40%TESNB/60% MSQ by weight). The pores observed in the dielectric layer of FIG. 1B are approximately 70 nm in size and distributed evenly throughout the dielectric layer. As can be seen from FIG. 1C as the amount of TESNB increased the number of pores present in the dielectric layer increased. However, the size of the pores remained about the same.

With regard to the discussion above it is believed, in an preferred embodiment, that the alkoxy silyl groups on the preferred sacrificial norbornene material reacts with those of the uncured preferred dielectric material, (e.g., MSQ, HSQ or a mixed silsesquioxanes) or assists to evenly disperse the sacrificial norbornene-type polymer material throughout the preferred dielectric material, thereby preventing agglomeration of the sacrificial material in the dielectric material. Specifically, it is believed that the sacrificial norbornene-type polymer material remains evenly dispersed throughout the dielectric material as discrete polymer units distributed throughout the polymer film due to bonding, via hydrolysis of the —Si—O—C$_2$H$_5$ groups of the norbornene-type polymer and the —Si—O—CH$_3$ or —Si—O—H groups of the dielectric material. This is believed to be followed by a condensation reaction during curing.

As stated above, preferably the decomposition temperature of the sacrificial material is at least 100° C., even more preferably the decomposition temperature of the sacrificial material is in the range of about 380° C. to about 450° C.

Prior to decomposition, the porous insulating compositions of the present invention preferably comprise at least about 40 percent by weight dielectric material, with the remainder being comprised of sacrificial material. More preferably, the porous insulating compositions of the present invention preferably comprise at least about 60 percent by weight dielectric material and more preferably the porous insulating compositions of the present invention preferably comprise at least about 80 percent by weight dielectric material, with the remainder being comprised of sacrificial material. Thus, the amount of sacrificial material in the present invention can range from about 0.1 percent by weight to about 60 percent by weight. Most preferably, prior to decomposition, the inventive porous insulating compositions comprises 20 percent by weight sacrificial material and 80 percent by weight dielectric material.

It should be noted that, in view of the above discussion with regard to the Examples, it was determined that the size of the pores formed by the decomposition of the sacrificial material in the present porous insulating compositions is mainly a function of the molecular the size of the sacrificial material used in present invention rather than the amount of sacrificial material present. That is, a sacrificial material with a larger molecular weight produces a larger average pore diameter or size upon decomposition and vice versa.

In view of the above, preferably the sacrificial material used in the present invention is a norbornene-type dimer, trimer, tertramer or polymer. In the case where a norbornene-type dimer or trimer is used it is possible to form, upon decomposition, pores having a diameter or about 10 Angstroms. On the other hand, when larger pores or voids are desired norbornene-type polymer having molecular weights in the range of about 1,000 to about 1,000,000 can be utilized.

Preferably, as stated above, the average pore diameter of the pores formed upon decomposition of the sacrificial material are at least about 10 Angstroms, and even more preferably about 10 nm.

Figure 2:
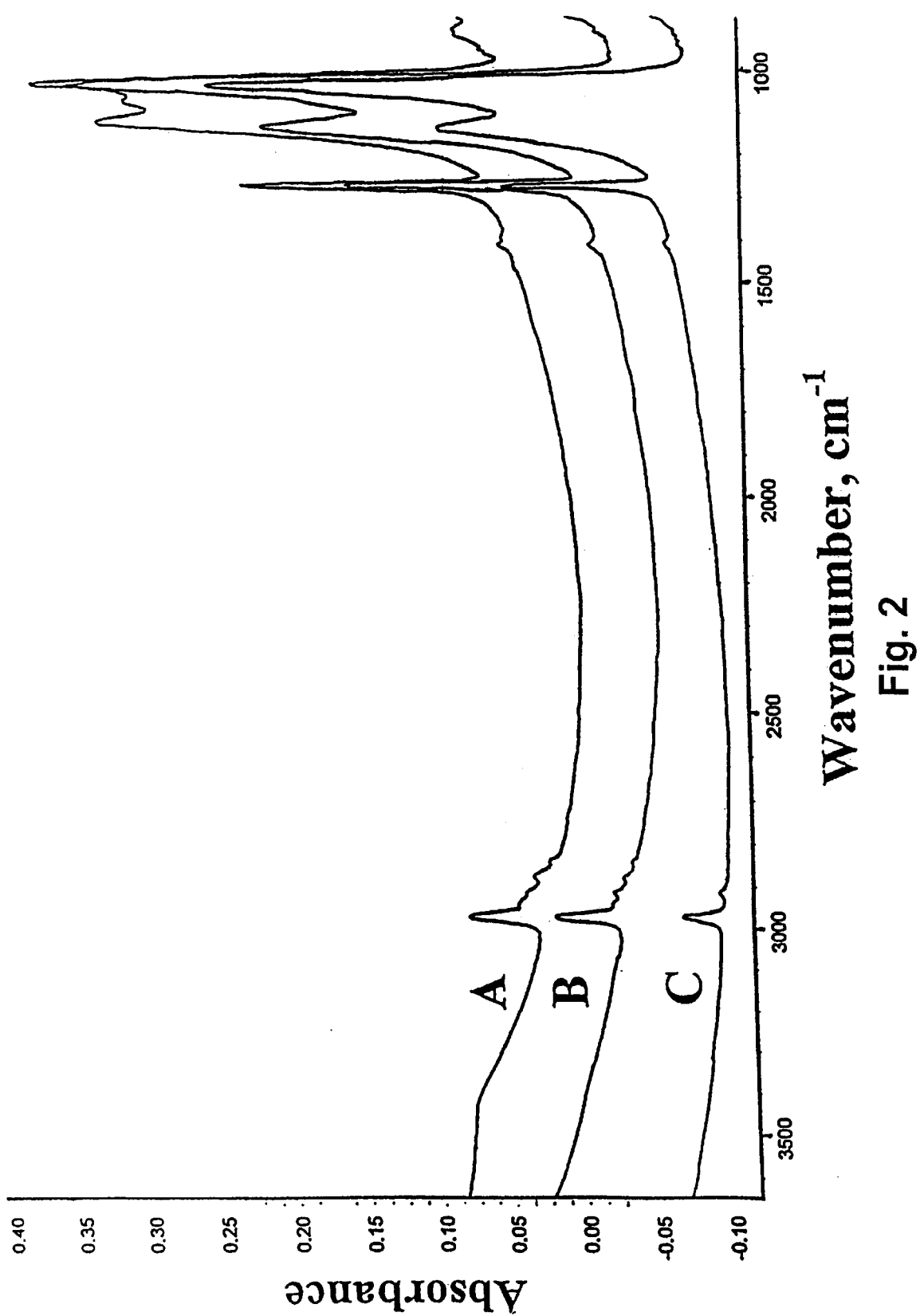
FIG. 2, line A depicts the infrared spectra after spin coating and soft baking of a porous insulating composition according to one embodiment of the present invention.

Turning to FIG. 2, FIG. 2, line A depicts the infrared spectra of the porous insulating composition of Example 1 of the present invention prior to decomposition but after curing (or backing) at about 180° C. The solution was spin coated onto a low-doped, double-sided polished silicon wafer. The wafer was quartered and heated to different temperatures. An un-coated silicon wafer was used for background subtraction. In FIG. 2, lines B and C depict, respectively, the infrared spectra for the composition of Example 1 after curing and decomposition was conducted at about 400° C. and about 425° C.

As can be seen from the infrared spectra contained in FIG. 2. The moisture content of the film is lowered significantly by heating the film at about 400° C. (Line B) or about 425° C. (Line C). This can be seen from the decrease in the Si—OH peaks at approximately 3400 cm$^{-1}$ and at approximately 870 to 950 cm$^{-1}$. The condensation cross-linking reaction of the silanol groups of the MSQ causes a change in the silsesquioxane peaks, which are observed at 1126 cm$^{-1}$ and 1026 cm$^{-1}$. A change in these peaks is observed between curing (Line A) and the samples subjected to curing and decomposition (Lines B and C). The Si—C stretch is observed at 1273 cm$^{-1}$, which is not changed by the curing of the MSQ at the decomposition temperatures of about 400° C. (Line B) and 425° C. (Line C).

Figure 3:
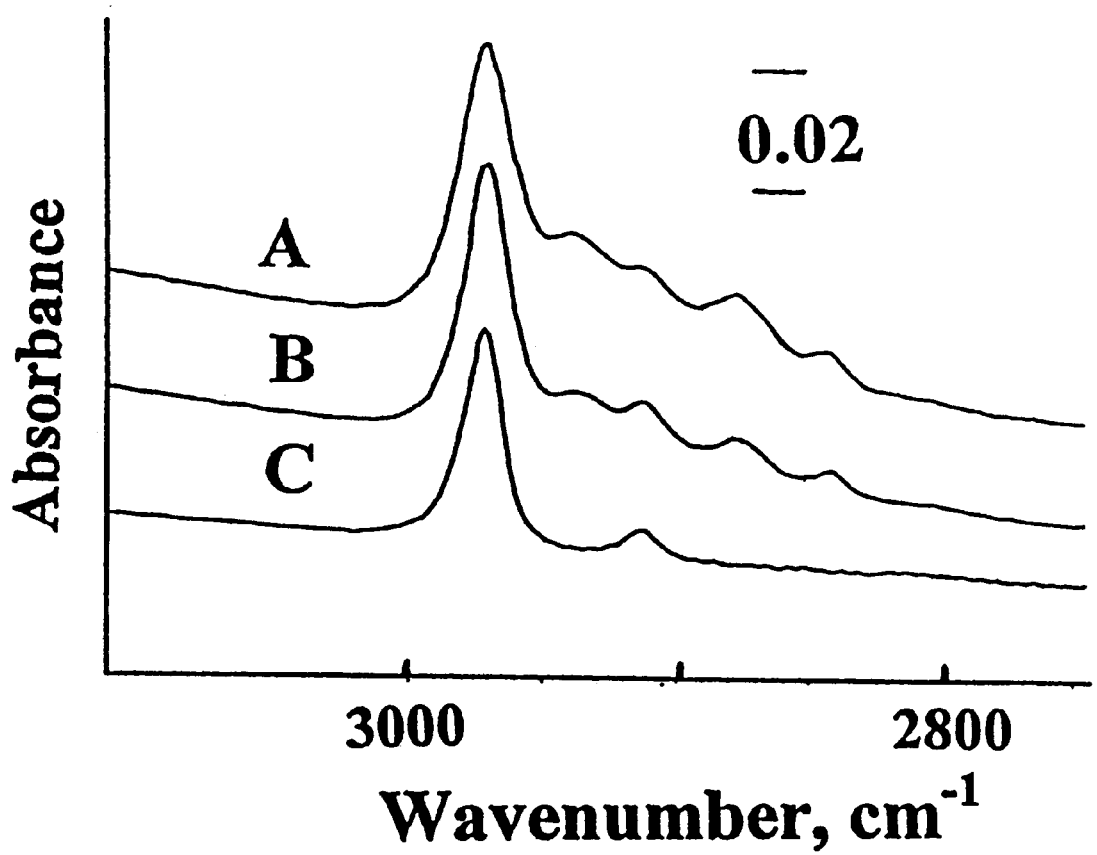
FIG. 3 depicts a detailed infrared spectra for lines A, B, and C of FIG. 2.

Continuing on, as can be seen from FIG. 2, the decomposition of the TESNB polymer lowers the absorbance of the C—H$_x$ stretching peaks between 2800 cm$^{-1}$ and 2980 cm$^{-1}$. A total of five peaks are expected in this region for the 20% TESNB polymer/80% MSQ mixture. As can be seen, there are two peaks each for C—H$_2$ and C—H$_3$ (symmetric and asymmetric stretches) and one peak for the C—H stretch. The MSQ contains only —CH$_3$ groups (two peaks), while the TESNB contains —CH$_3$, —CH$_2$, and —CH groups. The primary methyl peak for the MSQ is at 2873 cm$^{-1}$. However, the other C—H$_x$ assignments have not been confirmed because the unknown environment in the solid samples. Thus, the decomposition and diffusion of the TESNB polymer should result in the disappearance of three small peaks. This fact can be observed with reference to the spectra depicted in FIG. 3. Lines A, B and C of FIG. 3 correspond to the similarly letter lines of FIG. 2.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described integers (components, assemblies, devices, compositions, etc.), the terms (including a reference to a "means") used to describe such integers are intended to correspond, unless otherwise indicated, to any integer which performs the specified function of the described integer (i.e., that is functionally equivalent), even though not structurally equivalent to the disclosed structure which performs the function in the herein illustrated exemplary embodiment or embodiments of the invention. In addition, while a particular feature of the invention may have been described above with respect to only one of several illustrated embodiments, such feature may be combined with one or more other features of the other embodiments, as may be desired and advantageous for any given or particular application.

What is claimed is:

1. A composition useful in making a porous insulator, comprising:

at least one heat-activated, pore-forming, sacrificial material; and at least one dielectric material, wherein the at least one heat-activated, pore-forming, sacrificial material is selected from one or more norbornene-type polymers.

2. A composition as set forth in claim 1, wherein the dielectric material is a spin-on dielectric material.

3. A composition as set forth in claim 2, wherein the spin-on dielectric material is a silsesquioxane selected from methylsilsesquioxane, hydrogensilsesquioxane, and mixed silsesquioxanes.

4. A composition as set forth in claim 1, wherein the norbornene-type polymer comprises repeating units of the general formula:

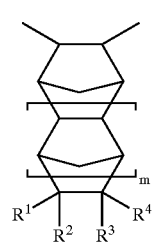

I wherein R$^1$ and R$^4$ independently represent hydrogen or linear or branched (C$_1$ to C$_{20}$) alkyl; R$^2$ and R$^3$ independently represent hydrogen, linear or branched (C$_1$ to C$_{20}$) alkyl or the groups:

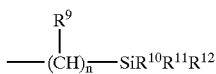

$R^9$ independently is hydrogen, methyl, or ethyl; $R^{10}$, $R^{11}$, and $R^{12}$ independently represent linear or branched ($C_1$ to $C_{20}$) alkyl, linear or branched ($C_1$ to $C_{20}$) alkoxy, linear or branched ($C_1$ to $C_{20}$) alkyl carbonyloxy, and substituted or unsubstituted ($C_6$ to $C_{20}$) aryloxy; m is a number from 0 to 4; and n is a number from 0 to 5; and at least one of substituents $R^2$ and $R^3$ is selected from the silyl group represented by the formula set forth under Ia.

5. A composition as set forth in claim 4, wherein at least one of $R^{10}$, $R^{11}$, or $R^{12}$ is selected from a linear or branched ($C_1$ to $C_{10}$) alkoxy group and $R^9$ is hydrogen.

6. A composition as set forth in claim 5, wherein each of $R^{10}$, $R^{11}$, and $R^{12}$ are the same and are selected from methoxy, ethoxy, propoxy, butoxy, and pentoxy.

7. A composition as set forth in claim 6, wherein n is 0 and $R^{10}$, $R^{11}$, and $R^{12}$ are each ethoxy groups.

8. A composition as set forth in claim 7, wherein $R^2$ or $R^3$ is a triethoxysilyl substituent.

9. A composition as set forth in claim 4, wherein in Formula I above, m is preferably 0 or 1 as represented by structures Ib and Ic, respectively:

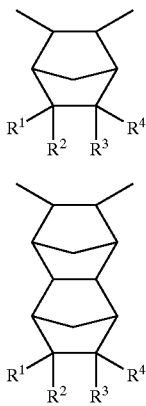

wherein $R^1$ to $R^4$ are as previously defined and at least one of $R^2$ and $R^3$ is a silyl substituent represented by Ia.

10. A composition as set forth in claim 4, wherein $R^1$ and $R^4$ taken together with the two ring carbon atoms to which they are attached comprise repeating units of the following structure:

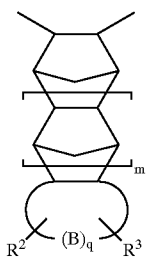

wherein B is a methylene group, q is a number from 2 to 6, and $R^2$ and $R^3$ are as defined above.

11. A composition as set forth in claim 4, wherein the norbornene-type polymer further comprises hydrocarbyl substituted polycyclic repeating units selected from units represented by Formula II below:

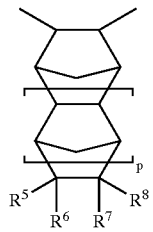

wherein $R^5$, $R^6$, $R^7$, and $R^8$ independently represent hydrogen, linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl, or vinyl; any of $R^5$ and $R^6$ or $R^7$ and $R^8$ can be taken together to form a ($C_1$ to $C_{10}$) alkylidenyl group, $R^5$ and $R^8$ when taken with the two ring carbon atoms to which they are attached can represent saturated and unsaturated cyclic groups containing 4 to 12 carbon atoms or an aromatic ring containing 6 to 17 carbon atoms; and p is 0, 1, 2, 3, or 4.

12. A composition as set forth in claim 3, wherein the norbornene-type polymer comprises repeating units represented by Formula III below:

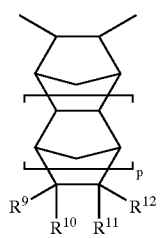

wherein $R^9$ to $R^{12}$ independently represent a polar substituent selected from the group: —$(A)_n$—C(O)OR", —$(A)_n$—OR", —$(A)_n$—OC(O)R", —$(A)_n$—OC(O)OR", —$(A)_n$—C(O)R", —$(A)_n$—OC(O)C(O)OR", —$(A)_n$—O—A'—C(O)OR", —$(A)_n$—OC(O)—A'—C(O)OR", —$(A)_n$—C(O)O—A'—C(O)OR", —$(A)_n$—C(O)—A'—OR", —$(A)_n$—C(O)O—A'—OC(O)OR", —$(A)_n$—C(O)O—A'—O—A'—C(O)OR", —$(A)_n$—C(O)O—A'—OC(O)C(O)OR", —$(A)_n$—C(R")$_2$CH(R")(C(O)OR"), and —$(A)_n$—C(R")$_2$CH(C(O)OR")$_2$; the moieties A and A' independently represent a divalent bridging or spacer radical selected from divalent hydrocarbon radicals, divalent cyclic hydrocarbon radicals, divalent oxygen containing radicals, and diivalent cyclic ethers and cyclic diethers; and n is an integer 0 or 1.

13. A composition as set forth in claim 3, wherein the norbornene-type polymer comprises copolymers comprising a combination of repeating units represented by Formulae I and II, Formulae I and III, Formulae II and III or Formulae I, II and III, where Formula I is:

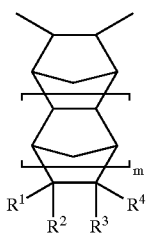

wherein $R^1$ and $R^4$ independently represent hydrogen or linear or branched ($C_1$ to $C_{20}$) alkyl; $R^2$ and $R^3$ independently represent hydrogen, linear or branched ($C_1$ to $C_{20}$) alkyl or the groups:

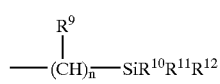

Ia $R^9$ independently is hydrogen, methyl, or ethyl; $R^{10}$, $R^{11}$, and $R^{12}$ independently represent linear or branched ($C_1$ to $C_{20}$) alkyl, linear or branched ($C_1$ to $C_{20}$) alkoxy, linear or branched ($C_1$ to $C_{20}$) alkyl carbonyloxy, and substituted or unsubstituted ($C_6$ to $C_{20}$) aryloxy; m is a number from 0 to 4; and n is a number from 0 to 5; and at least one of substituents $R^2$ and $R^3$ is selected from the silyl group represented by the formula set forth under Ia;

Formula II is

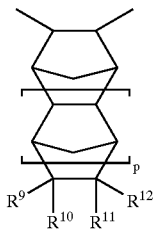

II wherein $R^5$, $R^6$, $R^7$, and $R^8$ independently represent hydrogen, linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl, or vinyl; any of $R^5$ and $R^6$ or $R^7$ and $R^8$ can be taken together to form a ($C_1$ to $C_{10}$) alkylidenyl group, $R^5$ and $R^8$ when taken with the two ring carbon atoms to which they are attached can represent saturated and unsaturated cyclic groups containing 4 to 12 carbon atoms or an aromatic ring containing 6 to 17 carbon atoms; and p is 0, 1, 2, 3, or 4; and Formula III is

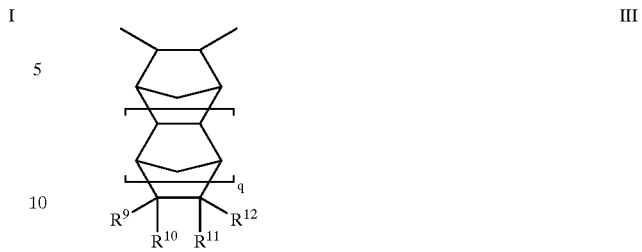

III wherein $R^9$ to $R^{12}$ independently represent a polar substituent selected from the group: —$(A)_n$—C(O)OR″, —$(A)_n$—OR″, —$(A)_n$—OC(O)R″, —$(A)_n$—OC(O)OR″, —$(A)_n$—C(O)R″, —$(A)_n$—OC(O)C(O)OR″, —$(A)_n$—O—A′—C(O)OR″, —$(A)_n$—OC(O)—A′—C(O)OR″, —$(A)_n$—C(O)O—A′—C(O)OR″, —$(A)_n$—C(O)—A′—OR″, —$(A)_n$—C(O)O—A′—OC(O)OR″, —$(A)_n$—C(O)O—A′—O—A′—C(O)OR″, —$(A)_n$—C(O)O—A′—OC(O)C(O)OR″, —$(A)_n$—C(R″)$_2$CH(R″)(C(O)OR″), and —$(A)_n$—C(R″)$_2$CH(C(O)OR″)$_2$; the moieties A and A′ independently represent a divalent bridging or spacer radical selected from divalent hydrocarbon radicals, divalent cyclic hydrocarbon radicals, divalent oxygen containing radicals, and; divalent cyclic ethers and cyclic diethers; and n is an integer 0 or 1.

14. A composition as set forth in claim 4, wherein the repeating units containing silyl functional groups comprise at least 1 mole percent of the polymer.

15. A composition as set forth in claim 14, wherein the repeating units containing silyl functional groups comprise at least 5 mole percent of the polymer.

16. A composition as set forth in claim 1, wherein the porous insulating material comprises at least about 10 percent by weight the heat-activated pore-forming sacrificial material, the remainder being the dielectric material.

17. A composition as set forth in claim 16, wherein the composition comprises at least about 20 percent by weight the heat-activated, pore-forming, sacrificial material and the remainder is dielectric material.

18. A composition as set forth in claim 17, wherein the composition comprises at least about 40 percent by weight the heat-activated, pore-forming, sacrificial material and the remainder is dielectric material.

19. A composition as set forth in claim 17, wherein the composition comprises about 60 percent by weight the pore-forming, heat-activated, sacrificial material and the remainder is dielectric material.

20. A semiconductor device which contains the composition of claim 1.

21. A composition useful in making a porous insulator, comprising:
at least one pore-forming, organic sacrificial material; and
at least one dielectric material,
wherein the at least one pore-forming, material is a norbornene-type polymer.

* * * * *